United States Patent
Youn et al.

(10) Patent No.: US 10,276,723 B2
(45) Date of Patent: Apr. 30, 2019

(54) FLEXIBLE DISPLAY

(71) Applicant: LG Display Co., Ltd., Seoul (KR)

(72) Inventors: Sangcheon Youn, Seoul (KR); Seyeoul Kwon, Paju-si, Gyeonggi-do (KR); Hoiyong Kwon, Busan (KR); Eunah Kim, Asan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/714,000

(22) Filed: Sep. 25, 2017

(65) Prior Publication Data

US 2018/0090617 A1    Mar. 29, 2018

(30) Foreign Application Priority Data

Sep. 23, 2016    (KR) ........................ 10-2016-0122489

(51) Int. Cl.
| | |
|---|---|
| *H01L 21/02* | (2006.01) |
| *H01L 27/12* | (2006.01) |
| *H01L 21/283* | (2006.01) |
| *H01L 29/417* | (2006.01) |
| *H01L 29/786* | (2006.01) |

(52) U.S. Cl.
CPC .... *H01L 29/7869* (2013.01); *H01L 21/02164* (2013.01); *H01L 21/02178* (2013.01); *H01L 21/02521* (2013.01); *H01L 21/02617* (2013.01); *H01L 21/283* (2013.01); *H01L 27/1218* (2013.01); *H01L 29/41733* (2013.01); *H01L 29/78603* (2013.01); *H01L 29/78618* (2013.01); *H01L 29/78633* (2013.01)

(58) Field of Classification Search
CPC ........... H01L 29/7869; H01L 21/02164; H01L 29/78603; H01L 27/1218; H01L 21/02178; H01L 29/78633; H01L 21/02617; H01L 21/283; H01L 29/41733; H01L 29/78618; H01L 21/02521; H01L 29/02617

See application file for complete search history.

(56) References Cited

U.S. PATENT DOCUMENTS

| | | | |
|---|---|---|---|
| 9,590,115 B2* | 3/2017 | Tanaka | H01L 27/1225 |
| 9,960,280 B2* | 5/2018 | Sato | H01L 29/7869 |
| 2004/0018674 A1 | 1/2004 | Ang et al. | |
| 2010/0073268 A1* | 3/2010 | Matsunaga | H01L 27/3262 345/76 |

(Continued)

FOREIGN PATENT DOCUMENTS

KR    10-2013-0036843 A    4/2013

OTHER PUBLICATIONS

Extended European Search Report dated Feb. 9, 2018 for the European patent application No. 17191834.5.

*Primary Examiner* — Victor A Mandala
(74) *Attorney, Agent, or Firm* — Polsinelli PC

(57) ABSTRACT

A flexible display is disclosed. The flexible display including an oxide semiconductor thin film transistor on a plastic substrate includes a first buffer layer disposed on the plastic substrate, a second buffer layer disposed on the first buffer layer and formed of silicon oxide (SiOx), and an active layer disposed on the second buffer layer and formed of an oxide semiconductor. The first buffer layer includes a lower layer directly contacting the plastic substrate and formed of silicon nitride (SiNx) and an upper layer disposed on the lower layer and formed of silicon oxide (SiOx).

20 Claims, 7 Drawing Sheets

(56) References Cited

U.S. PATENT DOCUMENTS

| | | | |
|---|---|---|---|
| 2011/0084268 A1* | 4/2011 | Yamazaki | H01L 27/1214 257/43 |
| 2014/0284594 A1* | 9/2014 | Nakano | H01L 27/1237 257/43 |
| 2016/0027920 A1* | 1/2016 | Kim | H01L 29/7869 257/43 |
| 2016/0066409 A1* | 3/2016 | Kwon | H05K 1/028 174/254 |
| 2016/0141310 A1 | 5/2016 | Park et al. | |
| 2016/0163868 A1* | 6/2016 | Kobayashi | H01L 29/7869 257/43 |
| 2016/0172623 A1* | 6/2016 | Lee | H01L 51/5253 257/40 |

\* cited by examiner

<Comparative example>

<Experimental example>

<Comparative example>

<Experimental example>

FLEXIBLE DISPLAY

CROSS-REFERENCE TO RELATED APPLICATION

This application claims the priority benefit of Korean Patent Application No. 10-2016-0122489 filed on Sep. 23, 2016, which is incorporated herein by reference in its entirety for all purposes as if fully set forth herein.

BACKGROUND

Field of the Disclosure

The present disclosure relates to a display device, and more particularly, to a flexible display. Although the present disclosure has a wide scope of applications, it is particularly suitable for preventing moisture penetration through a flexible substrate of the display device.

Description of the Background

With development of information society, demands for display devices displaying an image have been increased in various ways. In a field of the display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes a plurality of self-emitting elements capable of emitting light and has advantages of a fast response time, a high emission efficiency, a high luminance and a wide viewing angle. In particular, the OLED display may use a flexible plastic substrate. In addition, the OLED display has advantages of a lower driving voltage, lower power consumption, and better color tone as compared to a plasma display panel or an inorganic electroluminescent display.

The OLED display may include a plurality of buffer layers on a flexible plastic substrate. The plurality of buffer layers blocks ions or impurities diffused from the plastic substrate underlying the buffer layers in a manufacturing process of the OLED display. Further, the plurality of buffer layers blocks the penetration of external moisture from the plastic substrate after manufacturing of the OLED display is completed, thereby preventing the degradation of thin film transistors and organic light emitting diodes.

However, the buffer layer affects the component adjacent to the buffer layer due to the properties of a material constituting the buffer layer, thereby degrading characteristics of the component. For example, the buffer layer may include silicon nitride ($SiN_x$). When the thin film transistor includes an oxide semiconductor, hydrogen existing in silicon nitride of the buffer layer can be diffused and deteriorates electrical characteristics of the oxide semiconductor.

SUMMARY

The present disclosure is to provide a display device capable of preventing moisture penetration through a flexible plastic substrate of the display device.

The present disclosure is to also provide a flexible display capable of preventing electrical characteristics of an oxide semiconductor from being deteriorated by a silicon nitride layer constituting a buffer layer.

In one aspect of the present disclosure, there is provided a flexible display including an oxide semiconductor thin film transistor on a plastic substrate, the flexible display including a first buffer layer disposed on the plastic substrate, a second buffer layer disposed on the first buffer layer and formed of silicon oxide ($SiO_x$), and an active layer disposed on the second buffer layer and formed of an oxide semiconductor, wherein the first buffer layer includes a lower layer directly contacting the plastic substrate and formed of silicon nitride ($SiN_x$) and an upper layer disposed on the lower layer and formed of silicon oxide ($SiO_x$).

Another aspect of the present disclosure, a display device on a flexible substrate includes a first lower buffer layer disposed on the flexible substrate; a first upper buffer layer disposed on the first lower buffer layer, wherein the first lower buffer layer and the first upper buffer layer are formed of a different insulation material; a light shielding layer disposed on the first upper buffer layer; a second buffer layer disposed on the first upper buffer layer including the light shielding layer, wherein the second buffer layer and the first upper buffer layer are formed of the same material; and an active layer disposed on the second buffer layer and formed of an oxide semiconductor and vertically overlapping the light shielding layer.

A thickness of the lower layer is equal to or greater than a thickness of the upper layer.

The lower layer includes a first lower layer and a second lower layer that are formed by a separate process.

The first lower layer has a relatively higher density than a density of the second lower layer.

The flexible display further includes a light shielding layer disposed between the first buffer layer and the second buffer layer and overlapping the active layer.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the disclosure.

In the drawings.

DETAILED DESCRIPTION

Figure 1:
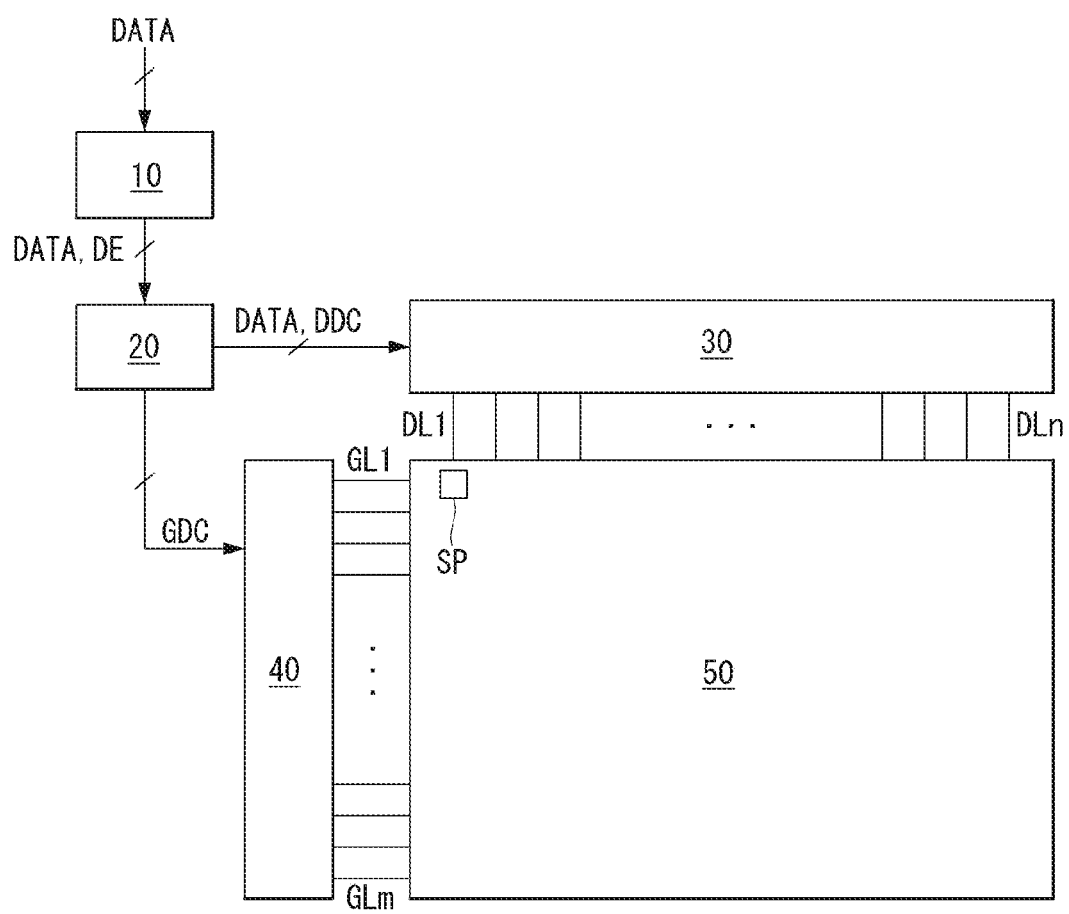
FIG. 1 is a schematic block diagram of a flexible display according to an aspect of the disclosure.

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure. Names of the respective elements used in the following explanations are selected only for convenience of writing the specification and may be thus different from those used in actual products.

A display device according to an aspect of the disclosure is a flexible display in which a display element is formed on a flexible plastic substrate. The flexible display according to the aspect of the disclosure may be implemented as a liquid crystal display (LCD), a field emission display (FED), a plasma display panel (PDP), an organic light emitting diode (OLED) display, an electrophoresis display (EPD), a quantum dot display (QDD), and the like. In the following description, for convenience of explanation, a case where the flexible display includes organic light emitting diodes will be described as an example.

A flexible display includes a first electrode, a second electrode opposite the first electrode, and an emission layer between the first electrode and the second electrode. The first electrode may be an anode electrode, and the second electrode may be a cathode electrode. The flexible display is a self-emission display device configured to form hole-electron pairs, i.e., excitons by combining holes received from the first electrode and electrons received from the second electrode inside the emission layer and emit light by an energy generated when the excitons return to the ground level.

The flexible display according to the aspect of the disclosure may be applied to both a top emission type display in which light is emitted upwardly, and a bottom emission type display in which light is emitted downwardly. In addition, the flexible display according to the aspect of the disclosure may be applied to a transparent display in which an object on the back side can be seen through the flexible display.

The flexible display according to the aspect of the disclosure uses a plastic substrate, for example, a polyimide (PI) substrate, so as to secure the flexibility of the display device. Because barrier characteristics of the plastic substrate are very low, a buffer layer performing a barrier function can be added to the plastic substrate. The buffer layer is positioned on the plastic substrate to block ions or impurities diffused from the plastic substrate and to prevent the moisture penetration from the outside.

In general, a silicon oxide ($SiO_x$) layer and a silicon nitride ($SiN_x$) layer are typically used as a buffer layer in the display device. Because the $SiO_x$ layer and the $SiN_x$ layer each have predetermined barrier characteristics, they can prevent the moisture penetration to the plastic substrate.

Minimum thicknesses of the $SiO_x$ layer and the $SiN_x$ layer required to satisfy the predetermined barrier characteristics are different from each other. As a result of actually measuring the minimum thicknesses of the $SiO_x$ layer and the $SiN_x$ layer capable of satisfying a water vapor transmission rate (WVTR) of $10^{-2}$ to $10^{-4}$ g/m²/day, the minimum thickness of the SiNx layer was approximately 8 nm, and the minimum thickness of the $SiO_x$ layer was approximately 25 nm. Namely, assuming that the $SiO_x$ layer and the $SiN_x$ layer have the same thickness, it can be seen that the barrier characteristics of the $SiN_x$ layer are much better than the barrier characteristics of the $SiO_x$ layer.

The aspect of the disclosure uses the $SiN_x$ layer as the component constituting the buffer layer, considering that i) the $SiO_x$ layer has the minimum thickness larger than the $SiN_x$ layer so as to satisfy the predetermined barrier characteristics, and ii) the flexibility of the display device is reduced as a thickness of the buffer layer increases.

However, because the display device according to the aspect of the disclosure includes a thin film transistor (TFT) using an oxide semiconductor, the aspect of the disclosure has to prevent hydrogen from entering the oxide semiconductor. Namely, a polycrystalline silicon semiconductor requires a hydrogenation process for filling vacancies of a polycrystalline silicon semiconductor material with hydrogen in consideration of deterioration in device characteristics resulting from the presence of vacancies. On the other hand, because a vacancy, in which a covalent bond is not formed, can serve as a carrier in an oxide semiconductor material, the oxide semiconductor material may need a certain amount of vacancies. Nonetheless, it is necessary to prevent a large amount of hydrogen from entering the oxide semiconductor.

More specifically, when the buffer layer includes the $SiN_x$ layer, hydrogen existing in the $SiN_x$ layer may be diffused into the oxide semiconductor and may change a concentration of carriers inside the channel of the thin film transistor. Hence, a threshold voltage of an oxide semiconductor thin film transistor may be shifted in a negative direction, or the channel of the oxide semiconductor thin film transistor may become conductive, thereby degrading the image quality of the display device. Because of the above problems, a $SiN_x$ layer was not able to be used as a buffer layer in the convention display device when an oxide semiconductor is used in a thin film transistor.

The aspect of the disclosure describes a structure in which the $SiN_x$ layer can be used as a buffer layer for a display device having an oxide semiconductor thin film transistor.

Figure 2:
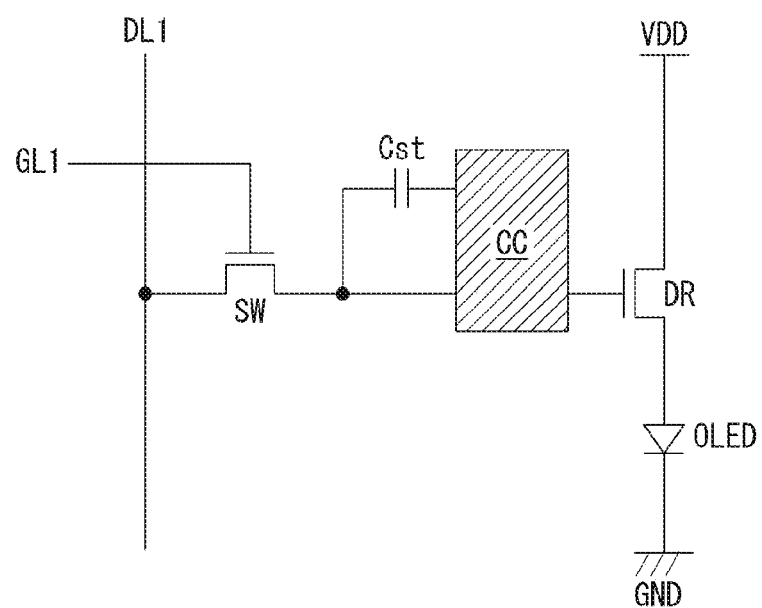
FIG. 2 illustrates an example of a circuit configuration of a subpixel of the flexible display.
Figure 3:
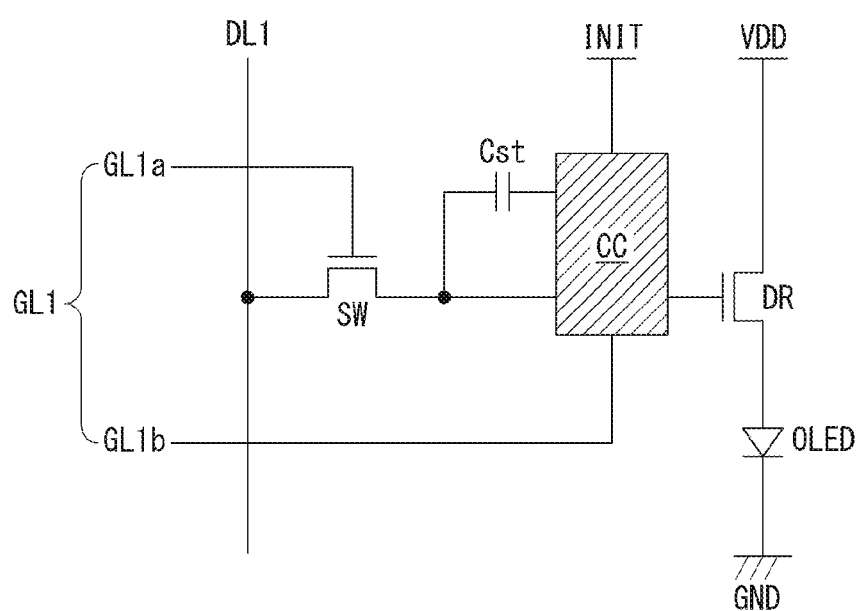
FIG. 3 illustrates another example of a circuit configuration of a subpixel of the flexible display.

FIG. 1 is a schematic block diagram of a flexible display according to an aspect of the disclosure. FIG. 2 illustrates an example of a circuit configuration of a subpixel of the flexible display. FIG. 3 illustrates another example of a circuit configuration of a subpixel of the flexible display.

Referring to FIG. 1, a flexible display according to an aspect of the disclosure includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For the sake of brevity and ease of reading, these signals are not shown. The image processing unit 10 is formed on a system circuit board as an integrated circuit (IC).

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is formed on a data circuit substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel 50 in a gate-in-panel (GIP) manner.

The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC and an organic light emitting diode (OLED). The organic light emitting diode operates to emit light based on a driving current generated by the driving transistor DR.

The switching transistor SW performs a switching operation so that a data signal supplied through a first data line DL1 is stored in a capacitor Cst as a data voltage in response to a gate signal supplied through a first gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC.

The compensation circuit CC includes one or more thin film transistors and a capacitor. Configuration of the compensation circuit CC may be variously changed depending on a compensation method. A brief description of the compensation circuit CC will be made.

As shown in FIG. 3, a subpixel including the compensation circuit CC may further include a signal line and a power line for driving a compensation TFT and supplying a predetermined signal or electric power. The added signal line may be defined as a 1-2 gate line GL1$b$ for driving the compensation TFT included in the subpixel. In FIG. 3, "GL1$a$" is a 1-1 gate line for driving the switching transistor SW. The added power line may be defined as an initialization power line INIT for initializing a predetermined node of the subpixel to a predetermined voltage. However, this is merely an example, and aspects are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the organic light emitting diode are provided. However, when the compensation circuit CC is added to the subpixel, the subpixel may have various configurations such as 3T1C, 4T2C, 5T2C, 6T2C, 7T1C, 7T2C, and the like.

Also, FIGS. 2 and 3 illustrate that the compensation circuit CC is positioned between the switching transistor SW and the driving transistor DR by way of an example. However, the compensation circuit CC may be further positioned between the driving transistor DR and the organic light emitting diode. The position and the structure of the compensation circuit CC are not limited to the examples illustrated in FIGS. 2 and 3.

Figure 4:
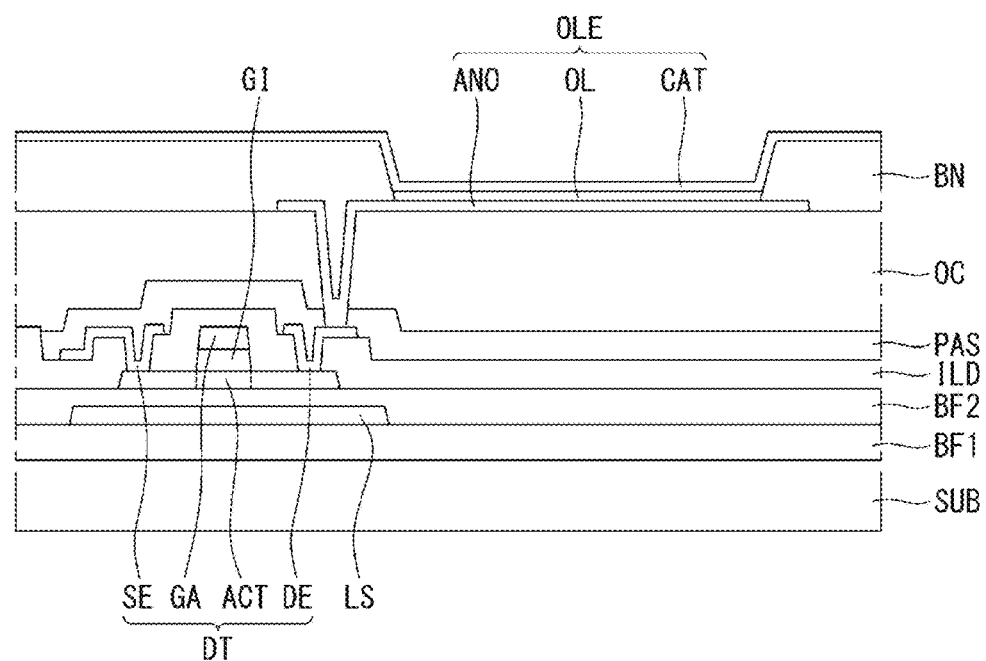
FIG. 4 is a cross-sectional view of a flexible display according to an aspect of the disclosure.
Figure 5:
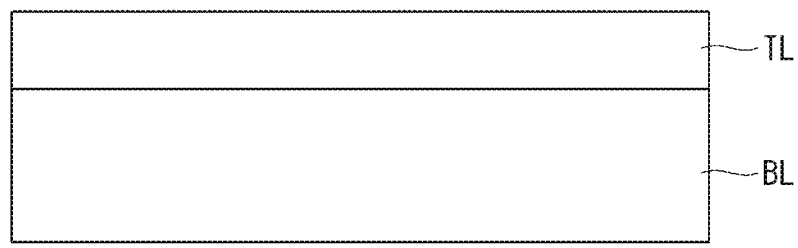
FIG. 5 schematically illustrates configuration of a first buffer layer according to an aspect of the disclosure.
Figure 6:
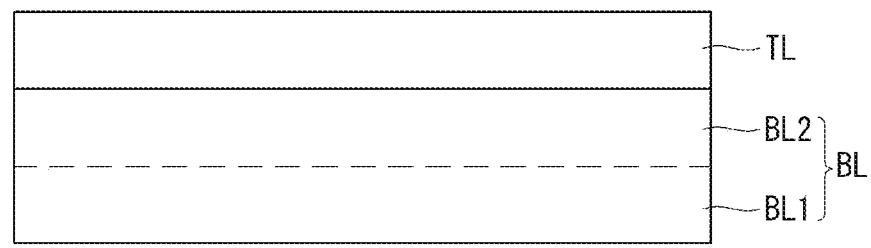
FIG. 6 schematically illustrates configuration of a first buffer layer according to another aspect of the disclosure.

FIG. 4 is a cross-sectional view of a flexible display according to an aspect of the disclosure. FIG. 5 schematically illustrates configuration of a first buffer layer according to an aspect of the disclosure. FIG. 6 schematically illustrates configuration of a first buffer layer according to another aspect of the disclosure.

Referring to FIGS. 4 and 5, a flexible display according to an aspect of the disclosure includes a thin film transistor DT and an organic light emitting diode OLE on a plastic substrate SUB. For example, the plastic substrate SUB may be a polyimide (PI) substrate. Thus, the flexible display according to the aspect of the disclosure may have flexible characteristic.

A first buffer layer BF1 and a second buffer layer BF2 are positioned between the plastic substrate SUB and the thin film transistor DT. The first buffer layer BF1 may have a thickness of 100 Å to 11,000 Å, and the second buffer layer BF2 may have a thickness of 100 Å to 10,000 Å. A light shielding layer LS is positioned between the first buffer layer BF1 and the second buffer layer BF2. The light shielding layer LS may be disposed to overlap an active layer ACT, particularly, a channel of the thin film transistor DT and protects an oxide semiconductor element from the external light.

The first buffer layer BF1 blocks ions or impurities diffused from the plastic substrate SUB and prevents the moisture penetration from the outside. The first buffer layer BF1 includes a lower layer BL formed of silicon nitride ($SiN_x$) and an upper layer TL formed of silicon oxide ($SiO_x$). The lower layer BL and the upper layer TL are sequentially stacked and are positioned between the plastic substrate SUB and the active layer ACT of the thin film transistor DT.

The lower layer BL is positioned on the plastic substrate SUB. The lower layer BL has a thickness enough to perform predetermined barrier characteristics and prevents the moisture penetration through the plastic substrate SUB. Because the lower layer BL is formed of silicon nitride ($SiN_x$), the lower layer BL can have the predetermined barrier characteristics with a thin thickness. Hence, the lower layer BL can prevent an increase in a thickness of the flexible display and secure predetermined flexibility of the flexible display. In other words, the lower layer BL may have a minimum thickness capable of satisfying the predetermined barrier characteristics. For example, the lower layer BL may have a thickness of 100 Å to 6,000 Å. The aspect of the disclosure sets the $SiN_x$ layer (i.e., the lower layer BL), that has the better barrier characteristics than the $SiO_x$ layer under the condition of the same thickness, as a layer directly contacting the plastic substrate SUB, thereby simultaneously securing the predetermined barrier characteristics and the predetermined flexibility.

Because the aspect of the disclosure directly forms the lower layer BL on the plastic substrate SUB so as to prevent the moisture penetration through the plastic substrate SUB, interface characteristics between the plastic substrate SUB and the lower layer BL need to be considered.

For example, when a $SiO_x$ layer is directly formed on the plastic substrate SUB, a peeling may occur at an interface between the plastic substrate SUB and the $SiO_x$ layer due to a difference between the properties of the plastic substrate SUB and the $SiO_x$ layer. The aspect of the disclosure sets the $SiN_x$ layer having more similar surface characteristics to the plastic substrate SUB than the $SiO_x$ layer as a layer directly contacting the plastic substrate SUB, thereby preventing or minimizing a defective adhesion that may occur at an interface between the plastic substrate SUB and the lower layer BL.

Because the aspect of the disclosure does not use an existing glass substrate but the plastic substrate SUB having a relatively low thermal conductivity, an auxiliary means for efficiently dissipating heat generated in an internal driving element, for example, the thin film transistor is necessary. The aspect of the disclosure directly forms the lower layer BL formed of silicon nitride ($SiN_x$) having a high thermal conductivity on the plastic substrate SUB, in order to efficiently dissipate heat. Thermal conductivity of silicon nitride ($SiN_x$) is approximately 15 times greater than thermal conductivity of silicon oxide ($SiO_x$). The aspect of the disclosure sets the $SiN_x$ layer having a high thermal conductivity as a layer directly contacting the plastic substrate SUB, thereby efficiently dissipating heat without using a separate auxiliary means.

The upper layer TL is positioned on the lower layer BL. The upper layer TL may have a thickness of 100 Å to 5,000 Å. The aspect of the disclosure can extend a length of a moving path of hydrogen existing in the lower layer BL toward the active layer ACT by disposing the upper layer TL between the lower layer BL and the active layer ACT. Further, the aspect of the disclosure can induce hydrogen diffused from the lower layer BL to the plastic substrate SUB, not to the active layer ACT, by forming the upper layer TL serving as a barrier on the lower layer BL. Hence, hydrogen diffused from the lower layer BL can move toward the plastic substrate SUB underlying the lower layer BL and can be easily released to the outside. The aspect of the disclosure brings the lower layer BL into contact with the plastic substrate SUB and stacks the upper layer TL on the lower layer BL, thereby preventing or reducing hydrogen from the lower layer BL from entering the active layer ACT. Hence, degradation in electrical characteristics of the oxide semiconductor can be minimized.

The thickness of the lower layer BL may be equal to or greater than the thickness of the upper layer TL. The lower layer BL may have enough thickness to block foreign substances from the outside. Further, the thickness of the upper layer TL may be equal or less than the thickness of the lower layer BL in consideration of the total thickness of the first buffer layer BF1 for the purpose of the flexibility of the flexible display.

Because ions or impurities diffused from the plastic substrate SUB and moisture from the outside are mostly blocked by the lower layer BL formed of silicon nitride ($SiN_x$), the upper layer TL formed of silicon oxide ($SiO_x$) may have a relatively thin thickness. Namely, the aspect of the disclosure can secure the reliability of water vapor transmission (or, water vapor permeation) with a thinner thickness, compared to when the lower layer BL is formed of only silicon oxide ($SiO_x$). Consequently, the aspect of the disclosure can prevent an increase in the total thickness of the flexible display while securing the barrier characteristics and secure predetermined flexibility of the flexible display.

Referring to FIG. 6, the lower layer BL constituting the first buffer layer BF1 may be divided into a first lower layer BL1 and a second lower layer BL2 and dividedly deposited. For example, the first lower layer BL1 and the second lower layer BL2 may be sequentially deposited in the same chamber at intervals of predetermined time. Both the first lower layer BL1 and the second lower layer BL2 may be formed of silicon nitride ($SiN_x$). The first lower layer BL1 may have a thickness of 100 Å to 3,000 Å, and the second lower layer BL2 may have a thickness of 100 Å to 3,000 Å.

In a chemical vapor deposition (CVD) process, the lower layer BL is not uniformly deposited on the plastic substrate SUB, and thus a thickness variation depending on a position may occur in the lower layer BL. In this instance, surface characteristics of the lower layer BL may be deteriorated, and the upper layer TL on the lower layer BL may be peeled off.

The aspect of the disclosure dividedly deposits the first lower layer BL1 and the second lower layer BL2 divided from the lower layer BL, thereby reducing the thickness variation of the lower layer BL. Namely, when the lower layer BL is deposited through a single process, a corresponding material may be intensively deposited at a specific position during the process, resulting in an excessive thickness variation. On the other hand, when the lower layer BL is dividedly deposited, processes can be performed in a temporally and/or spatially separated manner. Thus, even if a corresponding material is intensively deposited at a predetermined position during a first process, the position where the material is intensively deposited may be changed during a second process. Therefore, the thickness variation depending on the position can be reduced.

Further, the aspect of the disclosure can efficiently block a moisture penetration path, that may be formed in the lower layer BL during the process, by dividedly depositing the first lower layer BL1 and the second lower layer BL2 divided from the lower layer BL. Namely, micro-sized pores (or fine cracks) may be formed inside the lower layer BL deposited through the CVD process. When the lower layer BL is deposited through a single process, the micro-sized pores formed inside the lower layer BL may be extended to the thickness direction to form a moisture penetration path. On the other hand, when the lower layer BL is dividedly deposited, processes are performed in a temporally and/or spatially separated manner. Thus, even if the first micro-sized pores are generated in the first lower layer BL1 during the first process and the second micro-sized pores are generated in the second lower layer BL2 during the second process, the first micro-sized pores and the second micro-sized pores are separated from each other without being connected to each other. Therefore, the formation of the moisture penetration path in the thickness direction can be minimized.

The first lower layer BL1 and the second lower layer BL2 may have different densities. The first lower layer BL1 may be formed of silicon nitride ($SiN_x$) having a relatively higher density than the second lower layer BL2 and may have dense characteristics. The second lower layer BL2 may be formed of silicon nitride ($SiN_x$) having a relatively lower density than the first lower layer BL1 and may have porous characteristics. The aspect of the disclosure can further improve characteristic of the water vapor permeation by bringing the first lower layer BL1 having the relatively high density into contact with the plastic substrate SUB.

The second buffer layer BF2 is positioned on the first buffer layer BF1. The second buffer layer BF2 functions to prevent the active layer ACT of the thin film transistor DT from being contaminated by impurities and to insulate the light shielding layer LS from the active layer ACT. The second buffer layer BF2 is formed of silicon oxide ($SiO_x$). The second buffer layer BF2 may have a minimum thickness capable of insulating the light shielding layer LS and the active layer ACT from each other.

The aspect of the disclosure can further increase a length of a moving path of hydrogen existing in the lower layer BL toward the active layer ACT by further including the second buffer layer BF2 between the lower layer BL and the active layer ACT. Hence, the aspect of the disclosure can further reduce hydrogen of the lower layer BL from entering the active layer ACT and minimize a reduction in the electrical characteristics of the oxide semiconductor.

The thin film transistor DT includes the active layer ACT, a gate electrode GA, a source electrode SE, and a drain electrode DE. More specifically, the active layer ACT is positioned on the second buffer layer BF2. The active layer ACT is formed of an oxide semiconductor. Examples of the oxide semiconductor include a zinc oxide semiconductor such as indium gallium zinc oxide (IGZO). The oxide semiconductor has advantages that it has higher mobility than amorphous silicon and polycrystalline silicon and can be manufactured in a low-temperature process. Because the oxide semiconductor has a low OFF-current, the oxide semiconductor may be suitable for a thin film transistor which requires a short ON-time and a long OFF-time. Further, because the oxide semiconductor increases a voltage hold time of the pixel due to the low OFF-current, the oxide semiconductor may be suitable for a display device requiring a low-speed drive and/or low power consumption.

A gate insulating layer GI is positioned on the active layer ACT. The gate insulating layer GI insulates the gate electrode GA and may be formed of silicon oxide ($SiO_x$). The gate insulating layer GI may not include silicon nitride ($SiN_x$), in order to prevent hydrogen from entering the active layer ACT. The gate electrode GA is positioned on the gate insulating layer GI. The gate electrode GA may be formed as a single layer or a multilayer formed of one of copper (Cu), molybdenum (Mo), aluminum (Al), chrome (Cr), gold (Au), titanium (Ti), nickel (Ni), neodymium (Nd), tantalum (Ta), and tungsten (W) or a combination thereof. The gate electrode GA is positioned corresponding to the channel of the active layer ACT. An interlayer dielectric layer ILD is positioned on the gate electrode GA.

The interlayer dielectric layer ILD insulates the gate electrode GA and the active layer ACT underlying the interlayer dielectric layer ILD. The interlayer dielectric layer ILD may be formed as a silicon oxide ($SiO_x$) layer, a silicon nitride ($SiN_x$) layer, or a multilayer thereof. However, the interlayer dielectric layer ILD may not include the $SiN_x$ layer, in order to prevent hydrogen from entering the active layer ACT.

The interlayer dielectric layer ILD has contact holes CH exposing both sides (for example, a source region and a drain region) of the active layer ACT. The source electrode SE and the drain electrode DE are positioned on the interlayer dielectric layer ILD. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), and copper (Cu), or a combination thereof. When each of the source electrode SE and the drain electrode DE is formed as the multilayer, each of the source electrode SE and the drain electrode DE may be formed as a double layer of Mo/Al—Nd, Mo/Al, or Ti/Al or as a triple layer of Mo/Al—Nd/Mo, Mo/Al/Mo, or Ti/Al/Ti. The source electrode SE and the drain electrode DE are respectively connected to both sides of the active layer ACT through the contact holes CH of the interlayer dielectric layer ILD.

A passivation layer PAS is positioned on the thin film transistor DT. The passivation layer PAS protects the thin film transistor DT and may be formed as a silicon oxide ($SiO_x$) layer, a silicon nitride ($SiN_x$) layer, or a multilayer thereof. However, the passivation layer PAS may not include the $SiN_x$ layer, in order to prevent hydrogen from entering the active layer ACT.

A planarization layer OC is positioned on the passivation layer PAS and reduces a height difference of an underlying structure. The planarization layer OC may be formed of an organic material such as photo acryl, polyimide, benzocyclobutene-based resin, and acrylate-based resin. One of the passivation layer PAS and the planarization layer OC may be omitted, if necessary or desired.

The organic light emitting diode OLE is positioned on the planarization layer OC. The organic light emitting diode OLE includes a first electrode ANO, an organic light emitting layer OL, and a second electrode CAT. More specifically, the first electrode ANO is positioned on the planarization layer OC. The first electrode ANO is connected to the drain electrode DE of the thin film transistor DT through a contact hole penetrating the passivation layer PAS and the planarization layer OC. The first electrode ANO may serve as a transmissive electrode formed of a transparent conductive material such as indium tin oxide (ITO), indium zinc oxide (IZO), and zinc oxide (ZnO). Further, the first electrode ANO may further include a reflective layer and serve as a reflective electrode. The reflective layer may be formed of one of aluminum (Al), copper (Cu), silver (Ag), nickel (Ni), and palladium (Pd) or a combination thereof. For example, the reflective layer may be formed of an Ag/Pd/Cu (APC) alloy.

In addition, a bank layer BN defining the pixels is positioned on the plastic substrate SUB including the first electrode ANO. The bank layer BN may be formed of an organic material such as polyimide, benzocyclobutene-based resin, and acrylate. The organic light emitting layer OL is positioned on the first electrode ANO exposed by the bank layer BN. The organic light emitting layer OL is a layer, in which electrons and holes combine and emit light. The organic light emitting diode OLE may further include a hole injection layer and/or a hole transport layer between the organic light emitting layer OL and the first electrode ANO, and may further include an electron injection layer and/or an electron transport layer on the organic light emitting layer OL.

The second electrode CAT is positioned on the organic light emitting layer OL. The second electrode CAT may be formed of magnesium (Mg), calcium (Ca), aluminum (Al), silver (Ag), or a combination thereof each having a low work function. The second electrode CAT may be thin enough to transmit light and thus may serve as a transmissive electrode. Further, the second electrode CAT may be thick enough to reflect light and thus may serve as a reflective electrode.

The flexible display according to the aspect of the disclosure can block ions or impurities diffused from the plastic substrate and prevent the moisture penetration from the outside by forming the buffer layer including the $SiN_x$ layer.

The flexible display according to the aspect of the disclosure can implement the buffer layer having the thin thickness while securing the predetermined barrier characteristics by using the $SiN_x$ layer having a good water vapor transmission rate relative to a thickness. Thus, the aspect of the disclosure can provide the flexible display capable of preventing the moisture penetration from the outside while securing the flexibility of the display device.

The flexible display according to the aspect of the disclosure can prevent hydrogen included in the $SiN_x$ layer from entering the oxide semiconductor by forming the buffer layer including the $SiN_x$ layer and the $SiO_x$ layer stacked on the $SiN_x$ layer. Thus, the aspect of the disclosure can prevent deterioration in the electrical characteristics of the oxide semiconductor.

Figure 7A:
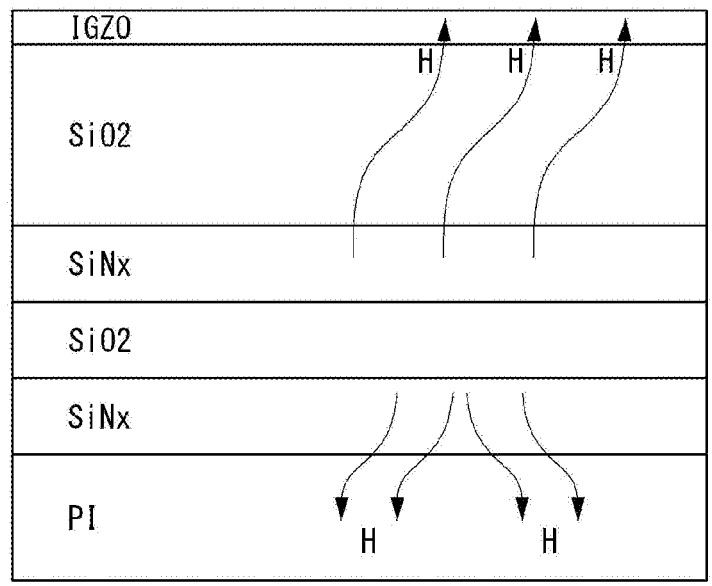
FIGS. 7A and 7B schematically illustrate a stacking structure of buffer layers according to a comparative example and an experimental example, respectively.
Figure 7B:
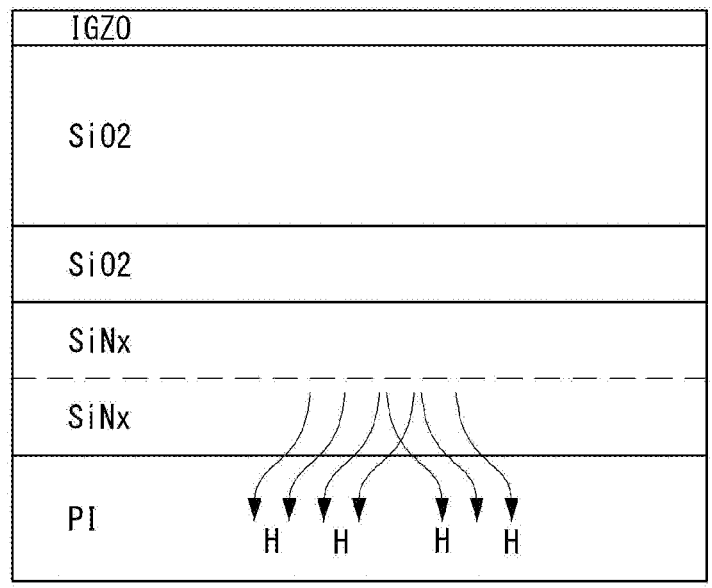
Figure 8A:
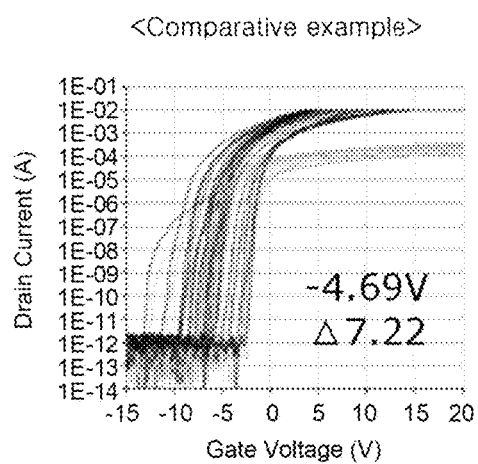
FIGS. 8A and 8B are graphs illustrating a current-voltage characteristic of an oxide semiconductor thin film transistor according to a comparative example and an experimental example, respectively.
Figure 8B:
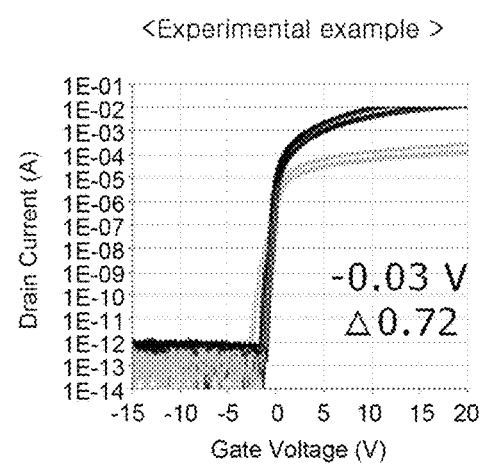

Effects of the flexible display according to the aspect of the disclosure will be described below through a comparative example and an experimental example. The experiments described below are only examples of the aspect of the disclosure, and the aspect of the disclosure is not limited to the following experimental examples. FIGS. 7A and 7B schematically illustrate stacking structures of buffer layers according to a comparative example and an experimental example, respectively. FIGS. 8A and 8B are graphs illustrating a current-voltage characteristic of an oxide semiconductor thin film transistor according to a comparative example and an experimental example, respectively.

The following experiments are to examine a change in characteristics of an oxide semiconductor depending on a difference in stacking order of a silicon oxide ($SiO_x$) layer and a silicon nitride ($SiN_x$) layer constituting a first buffer layer between a comparative example and an experimental example, when the first buffer layer according to the comparative example and the first buffer layer according to the experimental example have the same thickness.

COMPARATIVE EXAMPLE

As shown in FIG. 7A, a silicon nitride ($SiN_x$) layer, a silicon oxide ($SiO_x$) layer, and a silicon nitride ($SiN_x$) layer were sequentially stacked on a polyimide (PI) substrate, so that the comparative example was in contrast to the first buffer layer according to the aspect of the disclosure. A thickness of the SiNx layer was 1,000 Å, and a thickness of the SiOx layer was 1,000 Å.

Next, a silicon oxide ($SiO_x$) layer was stacked on the $SiN_x$ layer, so that the comparative example was in contrast to the second buffer layer according to the aspect of the disclosure. A thin film transistor including an IGZO active layer was manufactured on the $SiO_x$ layer. A thickness of the $SiO_x$ layer was 3,000 Å.

EXPERIMENTAL EXAMPLE

As shown in FIG. 7B, a silicon nitride ($SiN_x$) layer, a silicon nitride ($SiN_x$) layer, and a silicon oxide ($SiO_x$) layer constituting the first buffer layer according to the aspect of the disclosure were sequentially stacked on a polyimide (PI) substrate. A thickness of the $SiN_x$ layer was 1,000 Å, and a thickness of the $SiO_x$ layer was 1,000 Å.

Next, a silicon oxide ($SiO_x$) layer constituting the second buffer layer according to the aspect of the disclosure was stacked, and a thin film transistor including an IGZO active layer was manufactured on the $SiO_x$ layer. A thickness of the $SiO_x$ layer was 3,000 Å.

FIGS. 8A and 8B illustrates results of measuring a current-voltage characteristic of an oxide semiconductor thin film transistor according to the comparative example and the experimental example, respectively.

Referring to FIGS. 8A and 8B, a threshold voltage of an oxide semiconductor thin film transistor according to the comparative example was shifted by −4.69V in a negative direction and exceeded a normal range. Further, a threshold voltage of an oxide semiconductor thin film transistor according to the experimental example was shifted by −0.03V in the negative direction and was in the normal range.

It can be seen from the comparative example that when the first buffer layer includes the $SiN_x$ layer, and the $SiN_x$ layer is disposed at an uppermost layer of the first buffer layer, hydrogen existing in the $SiN_x$ layer is diffused into the IGZO active layer and changes the device characteristics. On the other hand, when the first buffer layer includes the $SiN_x$ layer, and the $SiO_x$ layer is further formed on the $SiN_x$ layer as in the experimental example, an amount of hydrogen existing in the $SiN_x$ layer entering the IGZO active layer was decreased. Hence, change in the device characteristics was also decreased. Thus, the aspect of the disclosure includes the first buffer layer including the $SiN_x$ layer and the $SiO_x$ layer and disposes the $SiO_x$ layer on the $SiN_x$ layer in the first buffer layer, thereby securing the reliability of the oxide semiconductor thin film transistor even when the $SiN_x$ layer is used.

Referring again to FIGS. 8A and 8B, a degree of scattering of the threshold voltage in the oxide semiconductor thin film transistor according to the comparative example was Δ7.22 which is beyond a normal range. On the contrary, a degree of scattering of the threshold voltage in the oxide semiconductor thin film transistor according to the experimental example was Δ0.72 which is in the normal range.

More specifically, when a thickness variation of the $SiN_x$ layer occurs depending on the position in the CVD process, an influence of the $SiN_x$ layer on the oxide semiconductor varies depending on the position. As a result, the degree of scattering of the threshold voltage of the oxide semiconductor increases.

The aspect of the disclosure can sufficiently secure a separation distance between the $SiN_x$ layer and the oxide semiconductor by disposing the $SiO_x$ layer on the $SiN_x$ layer in the first buffer layer. Hence, the aspects of the disclosure can prevent an influence of the $SiN_x$ layer on the oxide semiconductor even when the $SiN_x$ layer is formed to have the thickness variation depending on the position, thereby securing the reliability of the components.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flexible display device comprising an oxide semiconductor thin film transistor on a flexible substrate, comprising:
   a first buffer layer disposed on the flexible substrate;
   a second buffer layer disposed on the first buffer layer and formed of silicon oxide ($SiO_x$); and
   an active layer disposed on the second buffer layer and formed of an oxide semiconductor,
   wherein the first buffer layer comprises:
   a lower layer directly contacting the flexible substrate and formed of silicon nitride ($SiN_x$); and
   an upper layer disposed on the lower layer and formed of silicon oxide ($SiO_x$),
   wherein the lower layer comprises a first lower layer and a second lower layer disposed on the first lower layer, and
   wherein the first and second lower layers respectively include first and second micro size pores that are separated from each other.

2. The flexible display of claim 1, wherein the lower layer has a thickness equal to or greater than that of the upper layer.

3. The flexible display of claim 1, wherein the first and second lower layer are formed through a separate process.

4. The flexible display of claim 3, wherein the first and second lower layers have substantially the same thickness.

5. The flexible display of claim 4, wherein the first and second lower layers have a thickness between 100Å to 3,000Å.

6. The flexible display of claim 1, further comprising a light shielding layer disposed between the first buffer layer and the second buffer layer and overlapping the active layer.

7. A flexible display device comprising an oxide semiconductor thin film transistor on a flexible substrate, comprising:
a first buffer layer disposed on the flexible substrate;
a second buffer layer disposed on the first buffer layer and formed of silicon oxide ($SiO_x$); and
an active layer disposed on the second buffer layer and formed of an oxide semiconductor,
wherein the first buffer layer comprises:
a lower layer directly contacting the flexible substrate and formed of silicon nitride ($SiN_x$); and
an upper layer disposed on the lower layer and formed of silicon oxide ($SiO_x$),
wherein the lower layer comprises a first lower layer and a second lower layer disposed on the first lower layer, and
wherein the first lower layer has a density higher density than that of the second lower layer.

8. The flexible display device of claim 7, wherein the first lower layer has a density higher density than that of the second lower layer.

9. A display device on a flexible substrate, comprising:
a first lower buffer layer disposed on the flexible substrate;
a first upper buffer layer disposed on the first lower buffer layer, wherein the first lower buffer layer and the first upper buffer layer are formed of a different insulation material;
a light shielding layer disposed on the first upper buffer layer;
a second buffer layer disposed on the first upper buffer layer including the light shielding layer, wherein the second buffer layer and the first upper buffer layer are formed of the same material; and
an active layer disposed on the second buffer layer and formed of an oxide semiconductor and vertically overlapping the light shielding layer.

10. The display device of claim 9, wherein the second buffer layer electrically insulates the light shielding layer from the active layer.

11. The display device of claim 9, wherein the light shielding layer protects the active layer from external light.

12. The display device of claim 9, wherein the first lower buffer layer includes first and second insulation parts that are formed of the same insulation material and formed through a different process.

13. The display device of claim 12, wherein the first and second insulation parts are formed of silicon nitride.

14. The display device of claim 12, wherein the second buffer layer and the first upper buffer layer are formed of silicon oxide.

15. The display device of claim 12, wherein the first and second insulation parts have substantially the same thickness.

16. The display device of claim 15, wherein the first and have second insulation parts have a thickness between 100Å to 3,000Å.

17. The display device of claim 12, wherein the first and have second insulation parts respectively include first and second micro size pores that are separated from each other.

18. The display device of claim 12, wherein the first insulation part has a density higher than that of the second insulation part.

19. The display device of claim 9, wherein the device has a thin film transistor with a threshold voltage shifted by −0.03 V.

20. The display device of claim 19, wherein the threshold voltage has a degree of scattering in Δ0.72.

* * * * *